(12) United States Patent
Greeley et al.

(10) Patent No.: US 8,415,661 B2
(45) Date of Patent: Apr. 9, 2013

(54) METHODS OF SELF-ALIGNED GROWTH OF CHALCOGENIDE MEMORY ACCESS DEVICE

(75) Inventors: Neil Greeley, Boise, ID (US); Bhaskar Srinivasan, Boise, ID (US); Gurtej Sandhu, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/491,165

(22) Filed: Jun. 7, 2012

(65) Prior Publication Data

US 2012/0241911 A1  Sep. 27, 2012

Related U.S. Application Data

(63) Continuation of application No. 12/652,576, filed on Jan. 5, 2010, now Pat. No. 8,198,124.

(51) Int. Cl.
*H01L 29/06* (2006.01)
(52) U.S. Cl. .................. 257/41; 257/E25.017
(58) Field of Classification Search .................. 257/41, 257/E25.017
See application file for complete search history.

(56) References Cited

U.S. PATENT DOCUMENTS

| | | | |
|---|---|---|---|
| 6,750,101 B2 | 6/2004 | Lung | |
| 6,800,504 B2 | 10/2004 | Li et al. | |
| 6,855,975 B2 * | 2/2005 | Gilton | 257/296 |
| 7,030,405 B2 | 4/2006 | Campbell | |
| 7,057,202 B2 | 6/2006 | Ashton et al. | |
| 7,220,983 B2 | 5/2007 | Lung | |
| 2002/0093100 A1 | 7/2002 | Gonzalez et al. | |
| 2004/0036103 A1 | 2/2004 | Chen et al. | |
| 2006/0284237 A1 | 12/2006 | Park et al. | |
| 2008/0078983 A1 | 4/2008 | Raberg | |
| 2008/0113469 A1 | 5/2008 | Eun et al. | |
| 2009/0026437 A1 | 1/2009 | Kim et al. | |
| 2009/0072215 A1 | 3/2009 | Lung et al. | |
| 2009/0309087 A1 | 12/2009 | Lung | |
| 2010/0117046 A1 | 5/2010 | Chang et al. | |

OTHER PUBLICATIONS

V. Venkatasamy, et al, "ALD Approach toward Electrodeposition of $Sb_2Te_3$ for Phase-Change Memory Applications," Journal of the Electrochemical Society, 155, (2008) downloaded on Dec. 19, 2008, pp. D693-D698.
Chunfen Wang, et al., "Electrodeposition of $Sb_2Te_3$ Films on Si (100) and Ag Substrates," Electrochemical and Solid-State Letters, 9, (2006) downloaded on Nov. 5, 2008, pp. C147-C149.

* cited by examiner

*Primary Examiner* — Trung Q Dang
(74) *Attorney, Agent, or Firm* — Dickstein Shapiro LLP (57) ABSTRACT

Self-aligning fabrication methods for forming memory access devices comprising a doped chalcogenide material. The methods may be used for forming three-dimensionally stacked cross point memory arrays. The method includes forming an insulating material over a first conductive electrode, patterning the insulating material to form vias that expose portions of the first conductive electrode, forming a memory access device within the vias of the insulating material and forming a memory element over the memory access device, wherein data stored in the memory element is accessible via the memory access device. The memory access device is formed of a doped chalcogenide material and formed using a self-aligned fabrication method.

19 Claims, 9 Drawing Sheets

METHODS OF SELF-ALIGNED GROWTH OF CHALCOGENIDE MEMORY ACCESS DEVICE

CROSS-REFERENCE TO RELATED APPLICATIONS

This application is a continuation of U.S. patent application Ser. No. 12/652,576, filed on Jan. 5, 2010, now U.S. Pat. No. 8,198,124 the subject matter of which is incorporated in its entirety by reference herein.

FIELD OF THE INVENTION

Disclosed embodiments relate generally to memory devices and more particularly to methods of forming self-aligned, chalcogenide memory access devices for use in memory devices.

BACKGROUND

A non-volatile memory device is capable of retaining stored information even when power to the memory device is turned off. Traditionally, non-volatile memory devices occupied large amounts of space and consumed large quantities of power. As a result, non-volatile memory devices have been mainly used in systems where limited power drain is tolerable and battery-life is not an issue.

Figure 1:
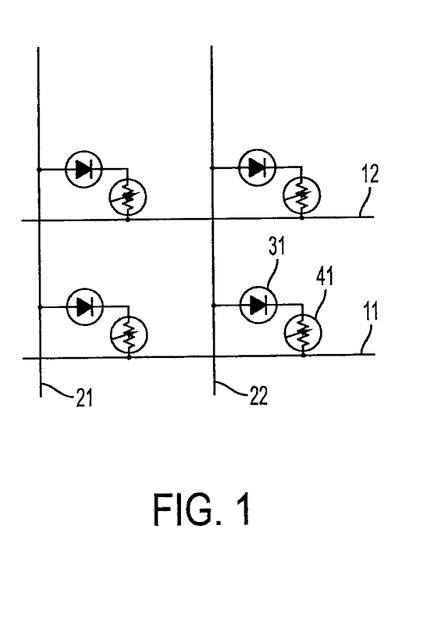
FIG. 1 illustrates a general structure of a cross point type memory device.

One type of non-volatile memory device includes resistive memory cells as the memory elements therein. Resistive memory elements are those where resistance states can be programmably changed to represent two or more digital values (e.g., 1, 0). Resistive memory elements store data when a physical property of the memory elements is structurally or chemically changed in response to applied programming voltages, which in turn changes cell resistance. Examples of variable resistance memory devices include memory devices that include memory elements formed using, for example, variable resistance polymers, perovskite materials, doped amorphous silicon, phase-changing glasses, and doped chalcogenide glass, among others. Memory access devices, such as diodes, are used to access the data stored in these memory elements. FIG. 1 illustrates a general structure of a cross point type memory device. Memory cells are positioned between access lines 21, 22, for example word lines, and data/sense lines 11, 12, for example bit lines. Each memory cell typically includes a memory access device 31 electrically coupled to a memory element 41.

As in any type of memory, it is a goal in the industry to have as dense a memory array as possible; therefore, it is desirable to increase the number of memory cells in an array of a given chip area. In pursuing this goal, some memory arrays have been designed in multiple planes in three dimensions, stacking planes of memory cells above one another. However, formation of these three-dimensional structures can be very complicated and time consuming. One of the limiting factors in forming such three-dimensional memory structures is the formation of the memory access devices. Traditional methods may require several expensive and extra processing steps and may also cause damage to previously formed materials during formation of subsequent materials.

Therefore, improved fabrication methods for forming memory access devices are desired.

DETAILED DESCRIPTION

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, without departing from the scope of the invention, only some of which are discussed in detail below.

According to disclosed embodiments, memory access devices for accessing memory elements of a memory cell are formed using self-aligning fabrication methods. Self-aligning fabrication techniques require fewer processing steps, and are thus more cost-effective, than many traditional methods, such as for example by reducing the number of masking steps required for fabrication. Self-aligned fabrication methods may also minimize the required contact area of the memory access device because they may provide superior fill capabilities.

Moreover, the self-aligning methods of the disclosed embodiments allow easy three-dimensional stacking of multiple levels of memory arrays. One way in which this is possible is because the self-aligning fabrication methods are implemented at low-temperatures (e.g., at or below 400° C.). Low temperature formation facilitates three-dimensional stacking of multiple memory levels because it limits damage to previously formed levels.

Additionally, according to the disclosed embodiments, the memory access devices are formed of Cu- or Ag-doped chalcogenide materials. Chalcogenide materials (doped with, e.g., nitride) are known in the art for use as a phase-change material for forming memory elements. However, it is also known that Cu- or Ag-doped chalcogenides, which act as electrolytes rather than as a phase-change material, are particularly suitable for use as memory access devices. In a Cu- or Ag-doped chalcogenide material, the metal "dopant" ions are mobile within the chalcogenide material. These "mobile"

ions are what allows current to flow through the chalcogenide material when utilized as a memory access device.

The use of Cu- or Ag-doped chalcogenide materials also provides desired benefits of high current density, e.g., greater than $10^6$ A/cm$^2$, and low threshold ON voltage (i.e., the minimum voltage required to "turn on" or actuate the device), e.g., less than 1V. The behavior can be made to represent a diode-like select device. These aspects of a memory access device are important for appropriate operation of a high-density memory device.

The memory access device 20 of the disclosed embodiments may be formed of any Cu- or Ag-doped chalcogenide material, including, for example, a Cu- or Ag-doped combination of Se and/or Te alloyed with one or more of Sb, In, Sn, Ga, As, Al, Bi, S, O and Ge. Specific examples of appropriate chalcogenide materials (e.g., chalcogenide alloys) (which are then doped with one of copper or silver) for use in the memory access devices of the disclosed embodiments include alloys of In—Se, Sb—Te, As—Te, Al—Te, Ge—Te, Ge—S, Te—Ge—As, In—Sb—Te, Te—Sn—Se, Ge—Se—Ga, Bi—Se—Sb, Ga—Se—Te, Sn—Sb—Te, Te—Ge—Sb—S, Te—Ge—Sn—O, Sb—Te—Bi—Se, Ge—Sb—Se—Te, and Ge—Sn—Sb—Te.

Figure 2A:
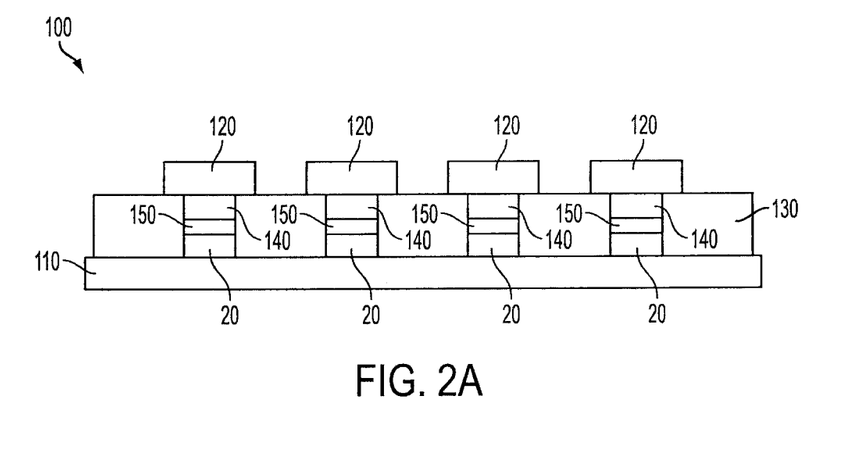
FIG. 2A illustrates a cross-sectional view of a cross point memory device including a memory access device according to disclosed embodiments.
Figure 2B:
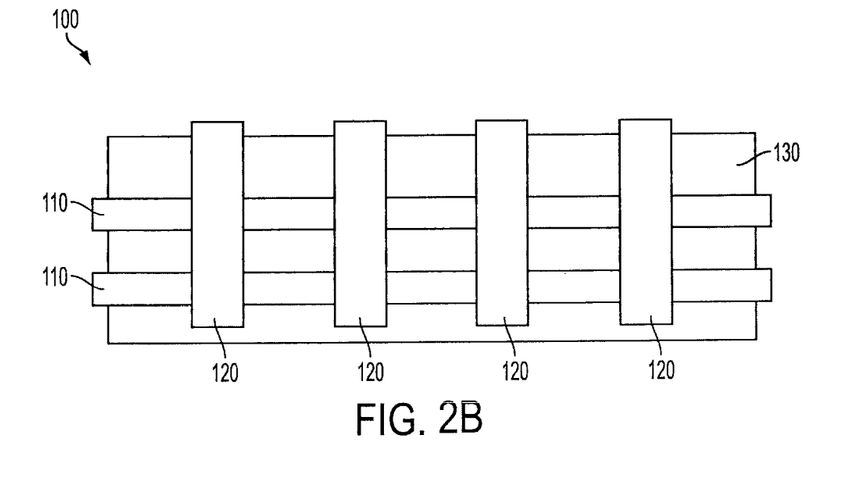
FIG. 2B illustrates a top view of the cross point memory device of FIG. 2A.

FIGS. 2A and 2B illustrate an example of a cross point memory device 100 including memory access devices 20 formed in accordance with the disclosed embodiments. FIG. 2A illustrates a cross-sectional view of the cross point memory device 100 and FIG. 2B illustrates a top-down view of the cross point memory device 100. A memory access device 20, an electrode 150 and a discrete memory element 140 are stacked at the intersection of the access lines 110, for example word lines, and the data/sense lines 120, for example bit lines, of the cross point memory device 100. Each discrete memory element 140 is accessed via the corresponding memory access device 20. Access lines 110 and data/sense lines 120 are formed of a conductive material, such as for example, aluminum, tungsten, tantalum or platinum, or alloys of the same. Suitable materials for electrode 150 include, for example, TiN, TaN, Ta, TiAlN and TaSiN. Memory element 140 may be formed of an appropriate variable resistance material including, for example, variable resistance polymers, perovskite materials, doped amorphous silicon, phase-changing glasses, and doped chalcogenide glass, among others. An insulating material 130, such as an oxide, fills the other areas of the memory device.

Figure 3A:
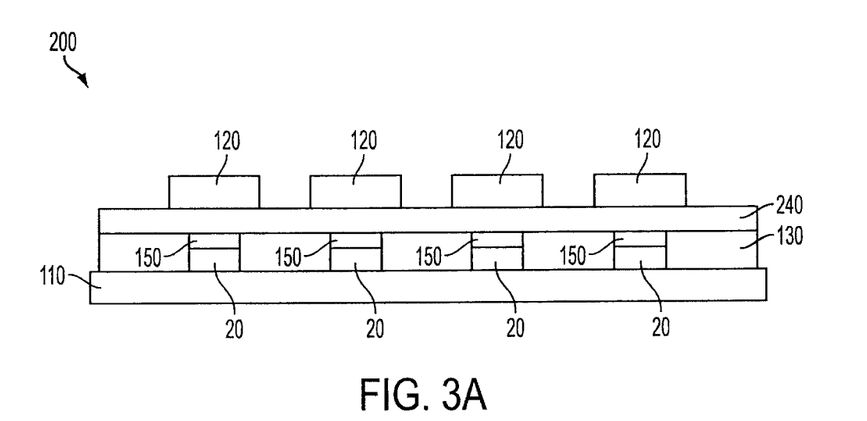
FIG. 3A illustrates an alternative configuration of a cross-sectional view of a cross point memory device including a memory access device according, to disclosed embodiments.
Figure 3B:
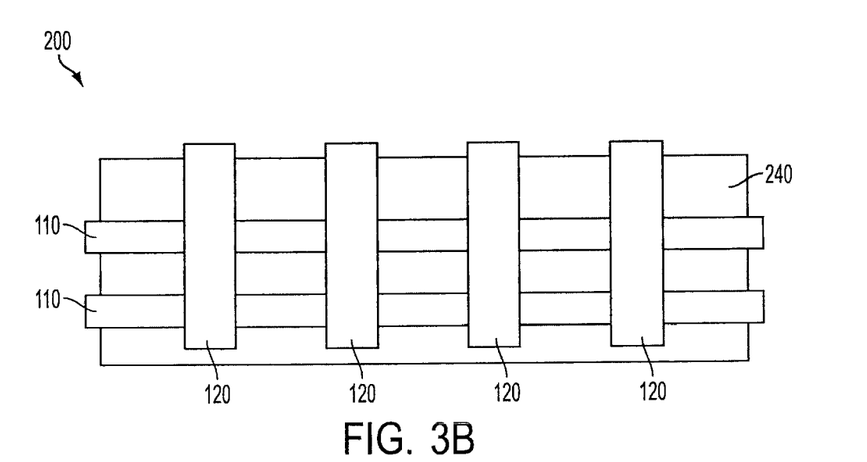
FIG. 3B illustrates a top view of the cross point memory device of FIG. 3A.

FIGS. 3A and 3B illustrate cross-sectional and top-down views, respectively, of an alternative arrangement of a cross point memory device 200. In FIGS. 3A and 3B, like elements are indicated by the same reference numerals from FIGS. 2A and 2B and are not described in detail. As can be seen in FIG. 3A, memory element 240 is formed as a continuous layer instead of being formed as discrete elements, as in memory element 140 (FIG. 2A). This configuration further reduces the complexity of manufacturing as well as alignment problems between the memory element 140 and corresponding electrodes 150/memory access devices 20.

Except for the formation of the memory access device 20, which is formed in accordance with the disclosed embodiments, the other elements of the cross point memory devices 100/200 (e.g., word lines, bit lines, electrodes, etc.) are formed using methods known in the art. An example method is now described; however any known fabrication methods may be used for the other elements of cross point memory devices 100/200. Access line 110 may be formed over any suitable substrate. The conductive material forming access lines 110 may be deposited with any suitable methodology, including, for example, atomic layer deposition (ALD) methods or plasma vapor deposition (PVD) methods, such as sputtering and evaporation, thermal deposition, chemical vapor deposition (CVD) methods, plasma-enhanced (PECVD) methods, and photo-organic deposition (PODM). Then the material may be patterned to form access lines 110 using photolithographic processing and one or more etches, or by any other suitable patterning technique. Insulating material 130 is next formed over access lines 110. The insulating material 130 may be deposited and patterned by any of the methods discussed with respect to the access lines 110 or other suitable techniques to form vias at locations corresponding to locations where access lines 110 and data/sense lines 120 will cross. Memory access devices 20 are then formed in the vias in accordance with the disclosed embodiments.

In the fabrication of memory device 100 (FIG. 2A/2B), after formation of memory access devices 20, an additional insulating material 130 may be formed over the memory access devices 20. This insulating material 130 is patterned to form vias at locations corresponding to the memory access devices 20 and electrodes 150 and memory elements 140 are deposited within the vias. Alternatively, material for forming electrodes 150 and memory elements 140 may be deposited above the memory access devices 20 and patterned to align with memory access devices 20, followed by deposition of additional insulating material 130 in vias formed by the patterning. After formation of the electrodes 150 and memory elements 140, the data/sense lines 120 are deposited and patterned by any of the methods discussed with respect to the access lines 110 or using other suitable techniques.

In the fabrication of memory device 200 (FIG. 3A/3B), after formation of memory access devices 20, an insulating material 130 may formed over the memory access devices 20. This insulating material 130 is patterned to form vias at locations corresponding to the memory access devices 20 and electrodes 150 are deposited within the vias. Alternatively, a material for forming electrodes 150 may be deposited above the memory access devices 20 and patterned to align with memory access devices 20, followed by deposition of additional insulating material 130 in vias formed by the patterning. After formation of the electrodes 150, a memory element 240 is deposited with any suitable methodology. Then, the data/sense lines 120 are deposited and patterned by any of the methods discussed with respect to the access lines 110 or using other suitable techniques.

Alternatively, access lines 110 may be formed by first forming a blanket bottom electrode and then, after formation of the memory access devices 20 (as described below), a cap layer is formed over the memory access device and the blanket bottom electrode is patterned to form the access lines 110.

It should be noted that while only a single-level cross point memory structure is illustrated in FIGS. 2A/2B and 3A/3B, multiple levels may be formed one over the other, i.e., stacked to form a three-dimensional memory array, thereby increasing memory density.

The memory access device 20 of the disclosed embodiments may be formed by one of several self-aligning fabrication techniques, described below.

Figure 4A:
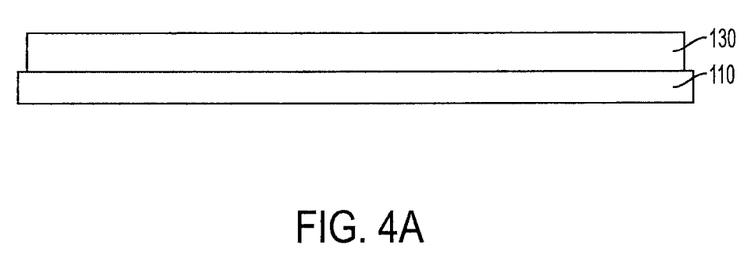
FIGS. 4A-4D each illustrates a cross-sectional view of an intermediate step in the fabrication of a memory device in accordance with disclosed embodiments.
Figure 4B:
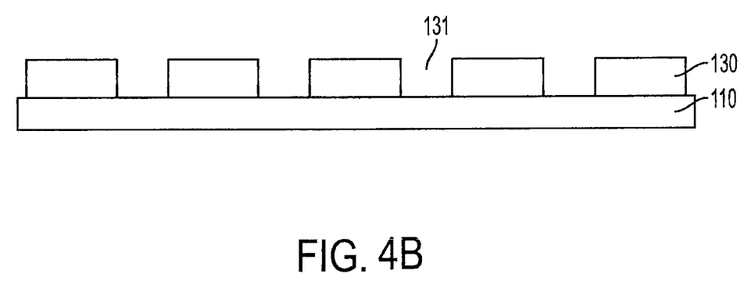
Figure 4C:
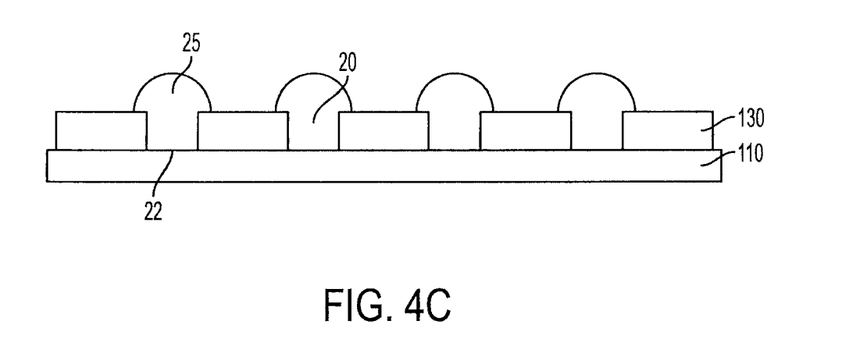
Figure 4D:
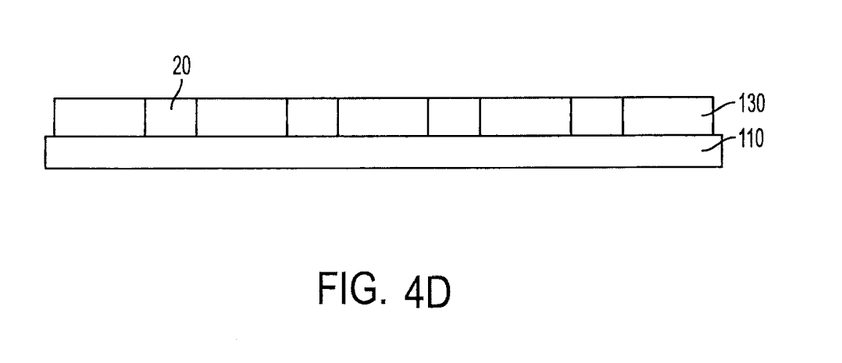

Referring to FIGS. 4A-4D, one method by which the memory access devices 20 of the disclosed embodiments may be formed is described. As seen in FIG. 4A, word line 110 and insulating material 130 are formed. This may be done, for example, by any suitable deposition methodology, including, for example, atomic layer deposition (ALD) methods or plasma vapor deposition (PVD) methods, such as sputtering and evaporation, thermal deposition, chemical vapor deposition (CVD) methods, plasma-enhanced (PECVD) methods, and photo-organic deposition (PODM). As seen in FIG. 4B, insulating material 130 is patterned to form vias 131 for memory access devices 20. This may be done, for example, by using photolithographic processing and one or more etches, or by any other suitable patterning technique. The vias 131 in insulating material 130 are formed to be at a sub-40 nm scale. Next, as seen in FIG. 4C, a Cu- or Ag-doped chalcogenide material is deposited by electrochemical deposition. Suitable materials for deposition by this process include any Cu- or Ag-doped combination of Se and/or Te alloyed with one or more of Sb, In, Sn, Ga, As, Al, Bi, S, O and Ge, as previously discussed. The exposed portions 22 of word line 110 provide a source for reduction/deposition for the electrochemical deposition process. The deposited Cu- or Ag-doped chalcogenide material thereby forms memory access devices 20 with the "mushroom" cap 25 overrun of the deposition process shown in FIG. 4C. After the electrochemical deposition process, the "mushroom" caps 25 are planarized, using for example a chemical mechanical planarization process, resulting in the structure shown in FIG. 4D. After planarizing, memory device 100/200 is completed by forming electrodes 150, memory elements 140/240 and bit lines 120 in accordance with known methods, as discussed above with respect to FIGS. 2A/2B and 3A/3B.

Figure 5A:
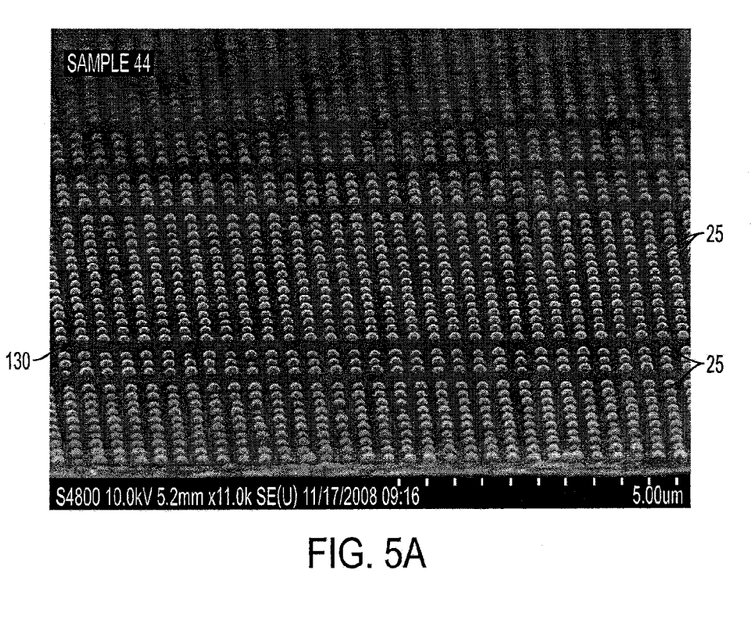
FIGS. 5A and 5B are scanning electron microscope photographs showing example memory access devices formed by a disclosed embodiment.
Figure 5B:
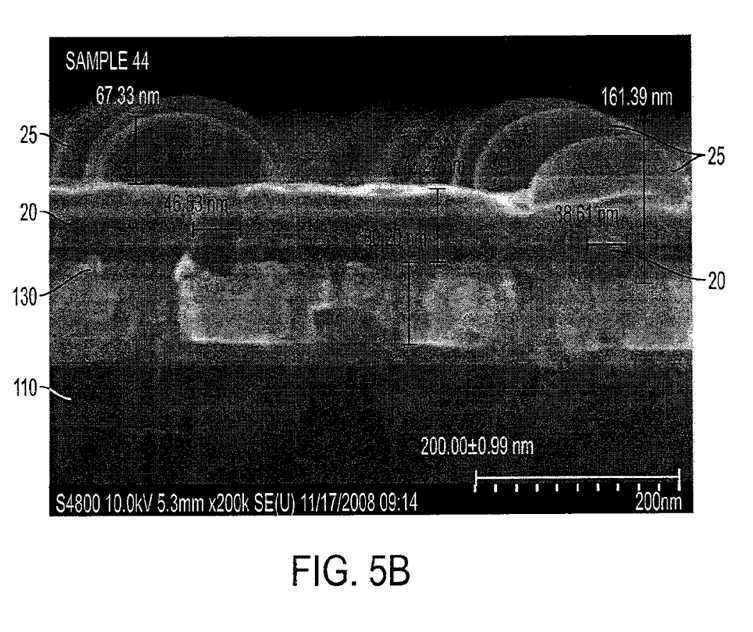

FIG. 5A illustrates a perspective view (scanning electron microscope) of an array of memory access devices 20 formed in accordance with this embodiment. FIG. 5B illustrates a cross-sectional view of a portion of the array shown in FIG. 5A. As can be seen in FIG. 5A, the memory access devices 20 (seen as "mushroom" caps 25 in FIG. 5A) are very reliably formed only in the desired row and column positions for forming a three-dimensionally stacked memory array. As can be seen in FIG. 5B, the contact fill (within the vias 131 in insulating material 130) is void-free, demonstrates long-range fill and the feature dimensions are at a scale that is sub-40 nm.

Using electrochemical deposition as a fabrication technique is inherently self-aligning because deposition occurs only on the exposed portions 22 of word lines 110. Further, using electrochemical deposition provides a bottom-up fill process because the exposed portions 22 of word line 110 are the only source for reduction during the electrochemical deposition process (e.g., deposition does not occur on the insulating material 130 located at the sides of opening 131). This results in a void-free contact fill of the high aspect ratio opening and thus a void-free memory access device 20. This process is able to be scaled to the desired sub-40 nm feature dimensions because only ions in solution are required to get into the contact vias thereby growing the material being deposited, as opposed to using physical deposition techniques which require the material being deposited to fill the vias directly.

Figure 6A:
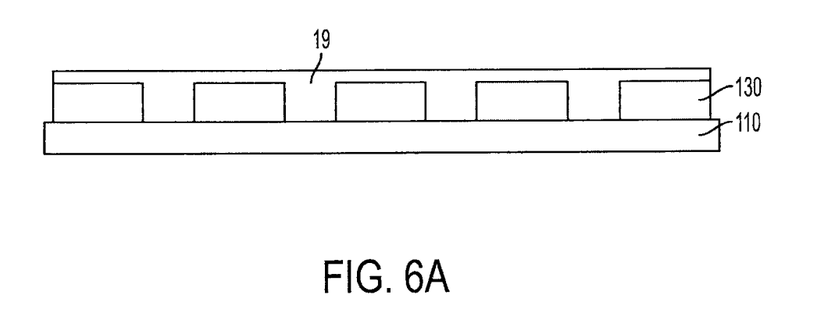
FIGS. 6A and 6B each illustrates a cross-sectional view of an intermediate step in the fabrication of a memory device in accordance with disclosed embodiments.
Figure 6B:
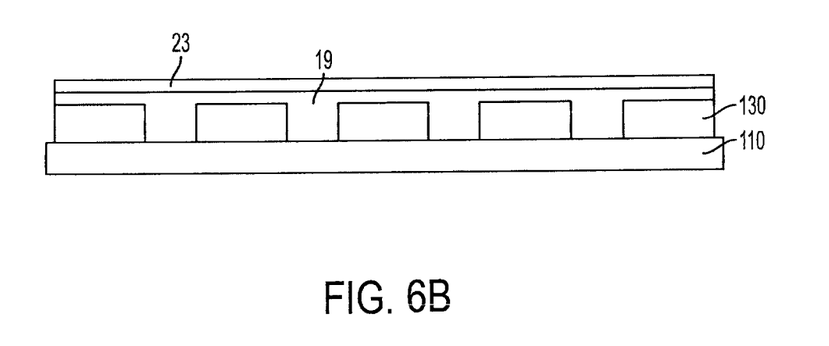

Referring to FIGS. 4A, 4B, 6A, and 6B, another method by which the memory access devices 20 of the disclosed embodiments may be formed is described. Word line 110 and insulating material 130 are formed (FIG. 4A) and vias 131 are formed in insulating material 130 (FIG. 4B), as previously discussed. Then, as seen in FIG. 6A, a vapor phase deposition method is used to deposit a chalcogenide material 19 in vias 131 (FIG. 4B). Suitable materials for deposition by this process include any combination of Se and/or Te alloyed with one or more of Sb, In, Sn, Ga, As, Al, Bi, S, O and Ge, as previously discussed. After deposition of the chalcogenide material 19, a dopant material 23 is deposited over chalcogenide material 19, seen in FIG. 6B. This may be done, for example, by electrochemical deposition or by vapor phase deposition of the dopant material 23. Dopant material 23 may be, for example, copper or silver. The chalcogenide material 19 is then doped with the dopant material 23 using, for example, an ultraviolet (UV) photodoping step. In UV photodoping, diffusion of metal atoms is photon-induced by directing electromagnetic radiation (e.g., UV light) at the metal (e.g., dopant material 23), resulting in diffusion of metal atoms from the metal into the chalcogenide material 19. Other suitable methods of doping the chalcogenide material 19 with ions from dopant material 23 may be used. The chalcogenide material 19 is thus doped with ions from dopant material 23, resulting in Cu- or Ag-doped chalcogenide material that forms memory access device 20. The dopant material 23 and the excess Cu- or Ag-doped-chalcogenide material 20 are planarized to the level of the top surface of insulating material 130, resulting in the structure illustrated in FIG. 4D. This may be done, for example, using chemical mechanical planarization (CMP), such as CuCMP in the case of a copper dopant material 23. After planarizing, memory device 100/200 is completed by forming electrodes 150, memory elements 140/240 and bit lines 120 in accordance with known methods, as discussed above with respect to FIGS. 2A/2B and 3A/3B.

Figure 7A:
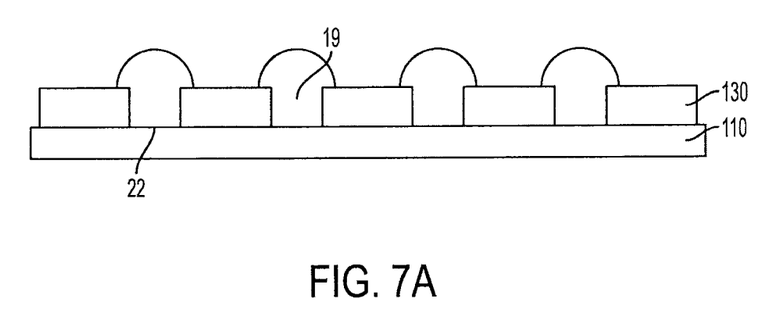
FIGS. 7A and 7B each illustrates a cross-sectional view of an intermediate step in the fabrication of a memory device in accordance with disclosed embodiments.
Figure 7B:
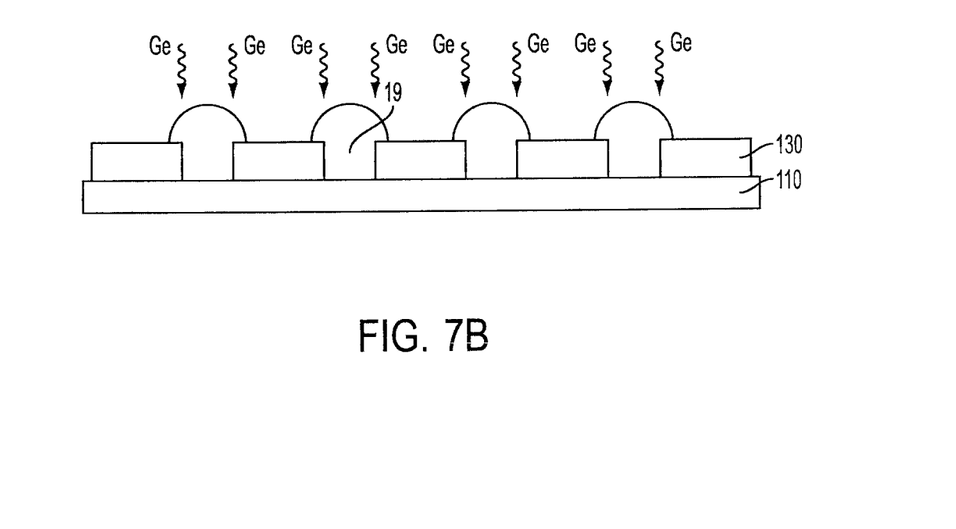

Referring to FIGS. 4A, 4B, 6B, 7A and 7B, another method by which the memory access devices 20 of the disclosed embodiments may be formed is disclosed. Word line 110 and insulating material 130 are formed (FIG. 4A) and vias 131 are formed in insulating material 130 (FIG. 4B), as previously discussed. Then, as seen in FIG. 7A, a chalcogenide material 19 is deposited in vias 131 (FIG. 4B) using an electrochemical deposition method. The deposition occurs as discussed above with respect to FIG. 4C. As described above, using an electrochemical deposition technique is inherently self-aligning because deposition occurs only on the exposed portions 22 of word lines 110 (FIG. 4B). In this embodiment, suitable materials for deposition include any combination of Se and/or Te alloyed with one or more of Sb, In, Sn, Ga, As, Al, Bi, S, and O, as previously discussed. Then, as shown in FIG. 7B, gas-cluster ion beam (GCIB) modification is used to infuse the chalcogenide material 19 with Ge. In gas-cluster ion beam (GCIB) modification, an accelerated gas-cluster ion beam including Ge is accelerated onto the surface of the chalcogenide material 19 to infuse the Ge into the surface of the chalcogenide material 19. After infusion of Ge in the chalcogenide material 19, the Ge-infused chalcogenide material 19 is doped with a dopant material 23. This may be accomplished as previously described with respect to FIG. 6B. Then, the dopant material 23 and the excess Ge-infused, Cu- or Ag-doped-chalcogenide material 20 are planarized to the level of the top surface of insulating material 130, resulting in the structure illustrated in FIG. 4D. This may be done, for example, using chemical mechanical planarization (CMP), such as CuCMP in the case of a copper dopant material 23. After planarizing, memory device 100/200 is completed by forming electrodes 150, memory elements 140/240 and bit lines 120 in accordance with known methods, as discussed above with respect to FIGS. 2A/2B and 3A/3B.

Alternatively to each of the above-described methods, a thicker insulating material 130 may be initially formed. In this instance, the electrochemical or vapor phase deposition of the Cu- or Ag-doped chalcogenide material 20 would not entirely fill the vias 131. Then, electrode 150 (and in the instance of memory device 100, memory element 140) may also be formed within via 131, allowing the entire portion of memory device 100/200 to be self-aligned.

Memory access devices formed in accordance with any of the previously disclosed embodiments may be formed at low temperatures, such as at or below 400° C. The manufacturing process of memory access devices, such as for example, conventional silicon-based junction diodes, requires much higher processing temperatures. Low temperature, formation allows for three-dimensional stacking of multiple memory levels without destruction of previously formed levels. Additionally, because the memory access devices are formed in a self-aligned manner, the methods are very cost-effective. Additionally, the use of Cu- or Ag-doped chalcogenide materials allows the memory access devices to have high current density, e.g., greater than $10^6$ A/cm$^2$ while maintaining and low threshold ON voltage, e.g., less than 1V.

Figure 8:
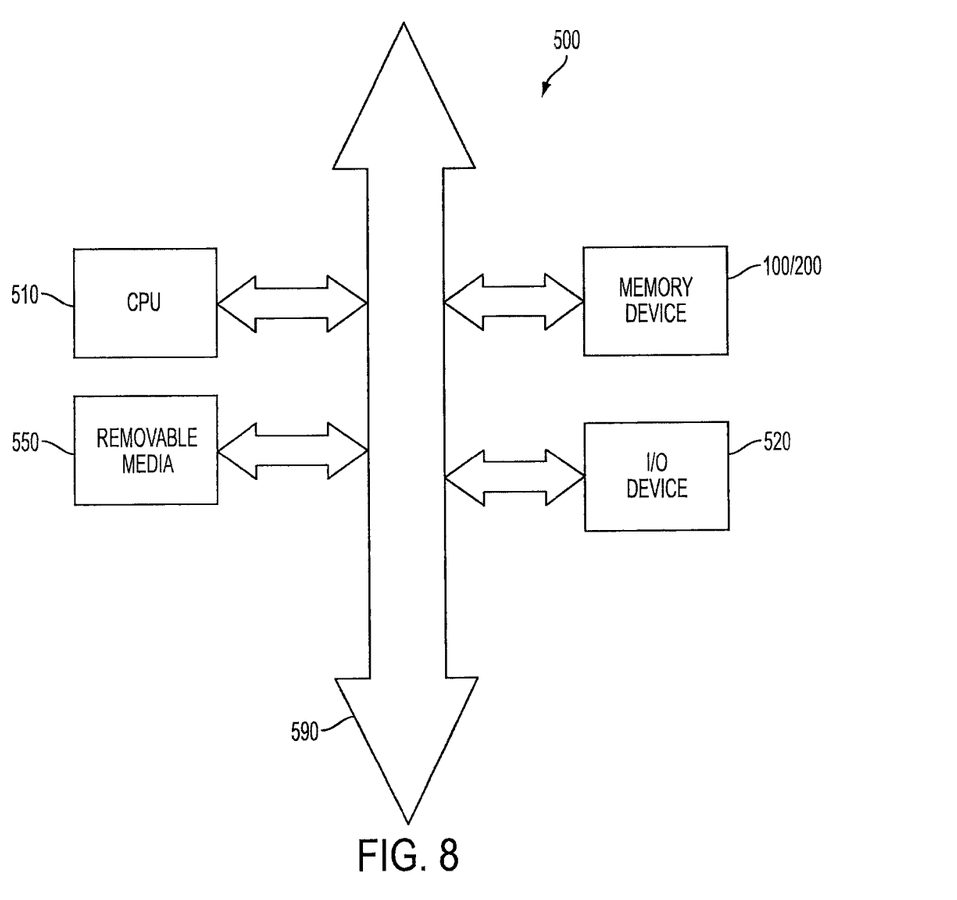
FIG. 8 illustrates a processor system that includes a memory device having memory access devices according to a disclosed embodiment.

The cross point memory array 100/200 (FIGS. 2A/2B and 3A/3B) may also be fabricated as part of an integrated circuit. The corresponding integrated circuits may be utilized in a typical processor system. For example, FIG. 8 illustrates a simplified processor system 500 which includes a memory device 100/200 including the self-aligned Cu- or Ag-doped chalcogenide memory access devices 20, in accordance with any of the above described embodiments. A processor system, such as a computer system, generally comprises a central processing unit (CPU) 510, such as a microprocessor, a digital signal processor, or other programmable digital logic devices, which communicates with an input/output (I/O) device 520 over a bus 590. The memory device 100/200 communicates with the CPU 510 over bus 590 typically through a memory controller. In the case of a computer system, the processor system 500 may include peripheral devices such as removable media devices 550 (e.g., CD-ROM drive or DVD drive) which communicate with CPU 510 over the bus 590. If desired, the memory device 100/200 may be combined with the processor, for example CPU 510, as a single integrated circuit.

The above description and drawings should only be considered illustrative of example embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A memory device comprising:
   an insulating material over a first conductive electrode, the insulating material including vias that expose portions of the first conductive electrode;
   a self-aligned doped chalcogenide memory access device formed within the vias of the insulating material, wherein the memory access device is doped with a dopant material which is one of Cu or Ag; and
   a memory element over the memory access device, wherein data stored in the memory element is accessible via the memory access device.

2. The memory device of claim 1, wherein the doped chalcogenide memory access device includes a chalcogenide material which comprises one of the group consisting of a Cu-doped combination of Se and/or Te alloyed with one or more of Sb, In and Ge.

3. The memory device of claim 1, wherein the doped chalcogenide memory access device includes a chalcogenide material which comprises one of the group consisting of a Ag-doped combination of Se and/or Te alloyed with one or more of Sb, In and Ge.

4. The memory device of claim 1, wherein the self-aligned memory access device is formed using electrochemical deposition.

5. The memory device of claim 1, wherein the self-aligned memory access device is formed using vapor phase deposition.

6. The memory device of claim 1, wherein the self-aligned doped chalcogenide memory access device is formed only on the exposed portions of the first conductive electrode.

7. The memory device of claim 1, wherein the vias in the insulating material have a width of 40 nm or less.

8. The memory device of claim 1, wherein the first conductive electrode is a word line.

9. The memory device of claim 1, further comprising a second conductive electrode over the memory element.

10. The memory device of claim 9, wherein the second conductive electrode is a bit line.

11. The memory device of claim 9, wherein the memory device is a cross point memory.

12. The memory device of claim 11, further comprising a plurality of repeated levels of individual memory devices, each repeated level comprising the first conductive electrode, the insulating material, the memory access device, the memory element and the second conductive electrode, wherein the cross point memory device comprises multiple levels of memory elements and memory access devices such that it is a three-dimensionally stacked memory device, and wherein each memory access device is a select device for a corresponding memory element.

13. A memory device comprising:
   an insulating material over a first conductive electrode, the insulating material including vias that expose portions of the first conductive electrode;
   a self-aligned Ge-infused doped chalcogenide memory access device formed within the vias of the insulating material, wherein the memory access device includes a chalcogenide material which is a combination of Se and/or Te alloyed with one or more of Sb and In; and
   a memory element over the memory access device, wherein data stored in the memory element is accessible via the memory access device.

14. The memory device of claim 13, wherein the chalcogenide material is infused with Ge using gas-cluster ion beam modification.

15. The memory device of claim 13, wherein the memory access device is doped with a dopant material which is one of Cu or Ag.

16. The memory device of claim 13, wherein the vias in the insulating material have a width of 40 nm or less.

17. The memory device of claim 13, wherein the memory device is a cross point memory.

18. The memory device of claim 17, further comprising a plurality of repeated levels of individual memory devices, each repeated level comprising the first conductive electrode, the insulating material, the memory access device, the memory element and the second conductive electrode, wherein the cross point memory device comprises multiple levels of memory elements and memory access devices such that it is a three-dimensionally stacked memory device, and wherein each memory access device is a select device for a corresponding memory element.

19. A memory device, comprising:
   a three-dimensionally stacked, cross point memory device formed by a plurality of repeated levels of individual memory devices, wherein each of the individual memory devices comprises:
      an insulating material over a first conductive electrode, the insulating material including vias that expose portions of the first conductive electrode;

a self-aligned doped chalcogenide memory access device formed within the vias of the insulating material;
a memory element over the memory access device, wherein data stored in the memory element is accessible via the memory access device; and
a second conductive electrode over the memory element.

* * * * *